United States Patent
Bade et al.

(10) Patent No.: US 9,673,805 B2
(45) Date of Patent: Jun. 6, 2017

(54) LEAKAGE CURRENT REDUCTION IN STACKED FIELD-EFFECT TRANSISTORS

(71) Applicant: International Business Machines Corporation, Armonk, NY (US)

(72) Inventors: Sarveswara Bade, Bangalore (IN); Shiu Chung Ho, Essex Junction, VT (US); Marcel A. Kossel, Reichenburg (CH); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 14/465,003

(22) Filed: Aug. 21, 2014

(65) Prior Publication Data

US 2016/0056809 A1 Feb. 25, 2016

(51) Int. Cl.
*H03K 17/16* (2006.01)
*G01R 31/00* (2006.01)

(52) U.S. Cl.
CPC ............. *H03K 17/16* (2013.01); *G01R 31/00* (2013.01); *H03K 17/162* (2013.01)

(58) Field of Classification Search
CPC ...................................................... H03K 17/16
See application file for complete search history.

(56) References Cited

U.S. PATENT DOCUMENTS

| | | | |
|---|---|---|---|
| 5,489,792 A | 2/1996 | Hu et al. | |
| 6,744,301 B1 | 6/2004 | Tschanz et al. | |
| 7,187,207 B2 | 3/2007 | Rowley | |
| 7,362,146 B2* | 4/2008 | Macaluso | H04L 25/0272 326/82 |
| 8,207,784 B2* | 6/2012 | Tsividis | G05F 3/205 327/534 |

OTHER PUBLICATIONS

Sharma et al., "Class-AB CMOS Buffer with Low Power and Low Leakage using Transistor Gating Technique", International Journal of Advanced Science and Technology, vol. 58, Sep. 2013, pp. 1-12, Science and Engineering Research Support SoCiety (SERSC), Tasmania, Australia.

Narendra et al., "Scaling of Stack Effect and its Application for Leakage Reduction", Proceedings of the 2001 International Symposium on Low Power Electronics and Design (ISLPED'01), Aug. 2001, pp. 195-200, ACM New York, NY, USA.

(Continued)

*Primary Examiner* — Hai L Nguyen
(74) *Attorney, Agent, or Firm* — Brandon C. Kennedy; Steven Meyers; Kennedy Lenart Spraggins LLP

(57) ABSTRACT

A method and system for reducing leakage current in a testing circuit are provided. Embodiments include a testing circuit that includes a digital buffer that includes a first transistor operatively coupled to a second transistor, where a drain of the first transistor is operatively coupled to a source of the second transistor. The second transistor is switched into cutoff mode. The digital buffer also includes a reference voltage generation circuit. The reference voltage generation circuit is operatively connected to the drain of the first transistor and the source of the second transistor. The reference voltage generation circuit is configured to reduce the leakage current in the digital buffer.

2 Claims, 10 Drawing Sheets

(56) References Cited

OTHER PUBLICATIONS

Wagh, "Minimizing Leakage for High-Performance CMOS Circuits", circuitdesign.info (online publication), Dec. 2008, pp. 1-4, URL: http://www.circuitdesign.info/blog/2008/12/minimizing-leakage-for-high-performance-cmos-circuits/.

Fallah et al., "Standby and Active Leakage Current Control and Minimization in CMOS VLSI Circuits", Institute of Electronics, Information and Communication Engineers (IEICE) Trans. on Electronics, Special Section on Low-Power LSI and Low-Power IP, vol. E88-C, No. 4, Apr. 2005, pp. 509-519, IEICE, Tokyo, Japan.

Rahman et al., "An Efficient Control Point Insertion Technique for Leakage Reduction of Scaled CMOS Circuits", IEEE Transactions on Circuits and Systems—II: Express Briefs, vol. 52, No. 8, Aug. 2005, 5 pages, Institute of Electrical and Electronics Engineers (IEEE) Society, USA.

Johnson et al., "Leakage Control With Efficient Use of Transistor Stacks in Single Threshold CMOS", IEEE Transactions on Very Large Scale Integration (VLSI) Systems, vol. 10, Issue 1, Aug. 2002, 4 pages, Institute of Electrical and Electronics Engineers (IEEE) Society, USA.

Hanchate et al., "A New Technique for Leakage Reduction in CMOS Circuits Using Self-Controlled Stacked Transistors", Proceedings of the 17th International Conference on VLSI Design, Jan. 2004, pp. 228-233, Institute of Electrical and Electronics Engineers (IEEE) Society, USA, DOI: 10.1109/ICVD.2004.1260929.

Abdollahi et al., "Runtime Mechanisms for Leakage Current Reduction in CMOS VLSI Circuits", IEEE Transactions on Very Large Scale Integration (VLSI) Systems, vol. 12, Issue 2, Feb. 2004, pp. 140-154, IEEE Educational Activities Department Piscataway, NJ, USA.

University of South Florida, "A Method and Apparatus for Reducing Leakage in CMOS Circuits", University Research paper, usf.edu (online publication), accessed May 2014, 1 page, URL: http://www.research.usf.edu/dpl/content/data/PDF/03B095.pdf.

* cited by examiner

LEAKAGE CURRENT REDUCTION IN STACKED FIELD-EFFECT TRANSISTORS

BACKGROUND

The present disclosure is generally related to circuit testing, or, more specifically, methods, apparatus, and products for reducing leakage current in a digital buffer of a testing circuit.

DESCRIPTION OF RELATED ART

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

In addition to increases in performance, technological advances that decrease the size of computer systems have also been made. Most modern computer components can be built together on a single semiconductor. These systems-on-a-chip (SOCs) are fabricated using an extremely high degree of precision and may require extensive testing to insure the entire system is operating to specification. Testing circuits may be used to send probing signals through various portions of the SOCs. Measurements taken from the SOCs in response to the probing signals aid manufacturers in determining whether a given SOC is operating to specification. Because the SOCs are manufactured using such a high degree of precision, the probing signals generated by the testing circuits must be equally capable of such precision.

SUMMARY

A method and system for reducing leakage current in a testing circuit are provided. Embodiments include a testing circuit that includes a digital buffer. The digital buffer includes a first transistor operatively coupled to a second transistor, where a drain of the first transistor is operatively coupled to a source of the second transistor.

The digital buffer also includes a reference voltage generation circuit. The reference voltage generation circuit is operatively connected to the drain of the first transistor and the source of the second transistor. The reference voltage generation circuit is configured to reduce the leakage current in the digital buffer. Reducing the leakage current in the digital buffer includes applying a reference voltage to the drain of the first transistor and the source of the second transistor when the digital buffer is in an off mode. Reducing the leakage current in the digital buffer also includes, pinching off the source-drain channel of the second transistor responsive to applying the reference voltage.

The foregoing and other objects, features and advantages described herein will be apparent from the following more particular descriptions of example embodiments as illustrated in the accompanying drawings wherein like reference numbers generally represent like parts of example embodiments.

DETAILED DESCRIPTION OF EXAMPLE EMBODIMENTS

Figure 1:
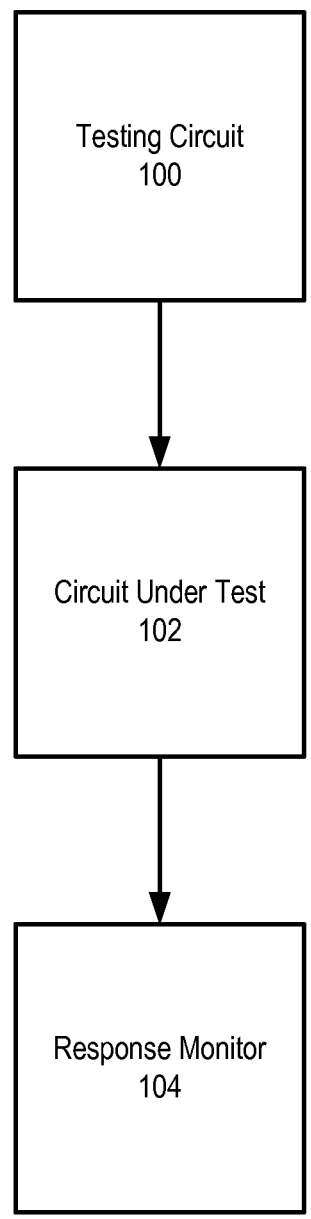
FIG. 1 sets forth a diagram of an example of a testing circuit, circuit under test, and response monitor configured according to embodiments.

Example methods, apparatus, and products for reducing leakage current in a testing circuit in accordance with embodiments described herein with reference to the accompanying drawings, beginning with FIG. 1. FIG. 1 sets forth a diagram of a system for reducing leakage current in a testing circuit according to embodiments described herein. The system of FIG. 1 includes a testing circuit (100), a circuit under test (102), and a response monitor (104).

The testing circuit (100) of FIG. 1 is a circuit with functionality to test a circuit under test (102). Specifically, the testing circuit (100) may probe the circuit under test (102) with signals and measure the response by the circuit under test (102) using the response monitor (104). The responses measured by the response monitor (104) may be evaluated to determine whether the circuit under test (102) is operating as designed. Specifically, the measured responses may be used to test, debug, characterize, and/or analyze one or more failures of the circuit under test (102).

The circuit under test (102) of FIG. 1 is a circuit with functionality to be probed by the testing circuit (100). Specifically, the circuit under test (102) may be implemented as any integrated circuit capable of being tested using the testing circuit (100) and the response monitor (104). In one or more embodiments, the circuit under test (102) is implemented as a SOC that integrates one or more components of a computer system on an integrated circuit. In one or more embodiments, the testing circuit (100) may be integrated into the circuit under test (102). Further detail regarding the testing circuit (100) is provided below in reference to FIGS. 2 through 10.

Figure 2:
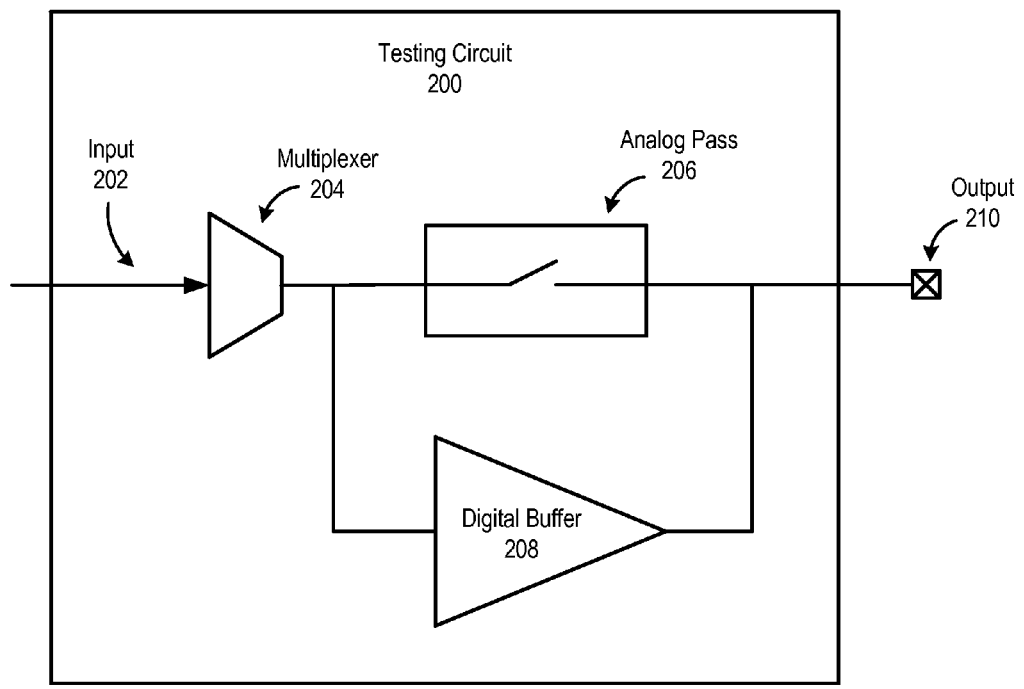
FIG. 2 sets forth a diagram of an example of a circuit device configured according to embodiments.

For further explanation, FIG. 2 sets forth a diagram of a system for reducing leakage current in a testing circuit according to embodiments described herein. The system of FIG. 2 includes a testing circuit (200) that includes an input (202), a multiplexer (204), an analog pass (206), a digital buffer (208), and an output (210).

In one or more embodiments, the testing circuit (200) includes functionality to transmit probing signals to a circuit under test via the output (210). The testing circuit (200) may include functionality to transmit probing signals to complex circuits under test, which may require a large number of different probing signals for proper testing. In one or more embodiments, the testing circuit (200) employs a multiplexing scheme to accomplish complex testing without necessitating a relatively large number of dedicated testing pins on the circuit under test.

The testing circuit (200) may output both analog and digital signals via the output (210). The analog signals and the digital signals may have different paths towards the output (210), and the testing circuit (200) may include functionality to enable one path and disable other paths at any given time. Leakage along one path (even while turned off) may affect the currently conducting path. Such leakage current may affect the results of the probing signals, and potentially have a negative effect on the circuit performance of the circuit under test.

The testing circuit (200) shown in FIG. 2 may be used to generate analog signals, low frequency digital signals and high and low frequency digital signals including, for example, clocking signals. An analog buffer (not shown) may be used for the critical analog signals in which isolation of the corresponding internal signal from an output influence is necessary to avoid internal signal malfunction. The analog pass (206) may be used to conduct stable analog signals, such as power supplies, and low frequency digital signals. The digital buffer (208) may be used to conduct high frequency digital signals.

Leakage current from the digital buffer (208) and analog pass (206) paths may not affect analog signals processed through an analog buffer (not shown). However, leakage current from the digital buffer (208) may affect analog circuit performance (e.g., conducted through the analog pass (206)).

Figure 3:
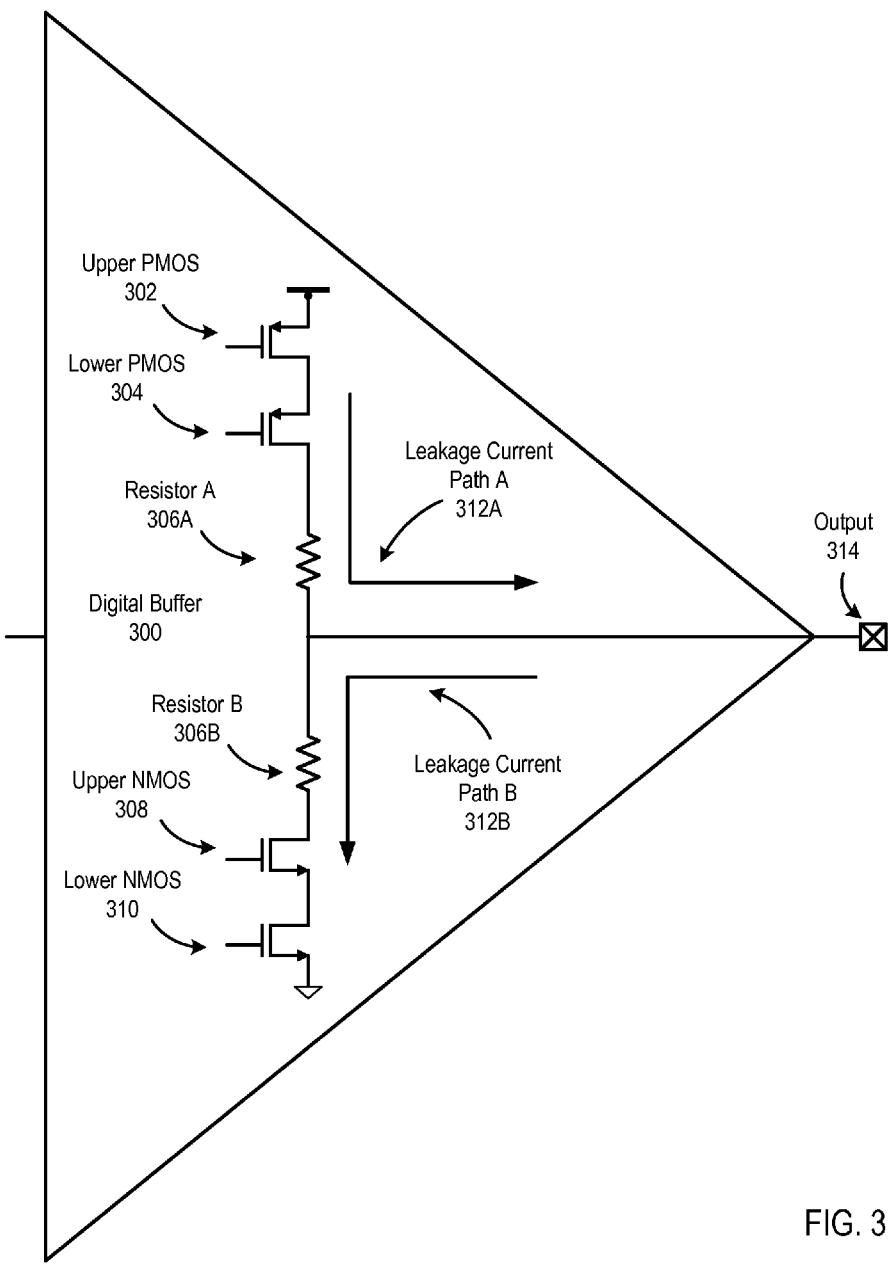
FIG. 3 sets forth a diagram of another example of a circuit device configured according to embodiments.

FIG. 3 sets forth a diagram of a system for reducing leakage current in a testing circuit according to embodiments described herein. Specifically, FIG. 3 shows a portion of the configuration of a digital buffer (300), as shown in FIG. 2. The digital buffer (300) of FIG. 3 includes an upper P-type metal-oxide-semiconductor (PMOS) transistor (302), a lower PMOS transistor (304), resistor A (306A), resistor B (306B), an upper N-type metal-oxide-semiconductor (NMOS) transistor (308), a lower NMOS transistor (310), leakage current path A (312A), leakage current path B (312B), and an output (314).

Each transistor (302, 304, 308, 310) may include a source terminal, a drain terminal, and a gate terminal. Further, each transistor may have different modes of operation, including an active mode and a cut-off mode. When placed in active mode, the size of the source-drain (S-D) channel of the upper PMOS transistor (302), lower PMOS transistor (304), upper NMOS transistor (308), and lower NMOS transistor (310) is increased and current may flow easily. When placed in cut-off mode, the size of the S-D channel of each transistor (302, 304, 308, 310) is decreased and current may be reduced.

Leakage current, however, may exist along sections of the circuit even at a transistor in cutoff mode. As shown in FIG. 3, leakage current may exist along leakage current path A (312A) and leakage current path B (312B). The leakage current along leakage current path A (312A) and leakage current path B (312B) may be reduced by applying one or more reference voltages (not shown) to the circuit.

Figure 4:
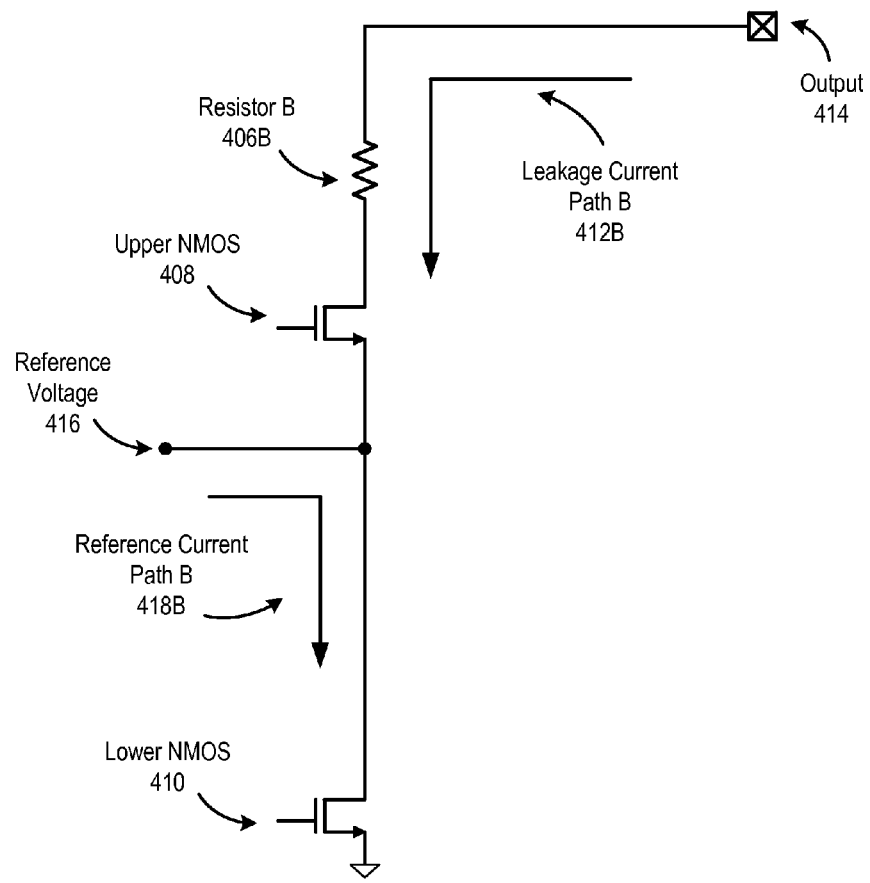
FIG. 4 sets forth a diagram of another example of a circuit device configured according to embodiments.

FIG. 4 sets forth a diagram of a system for reducing leakage current in a testing circuit according to embodiments described herein. Specifically, FIG. 4 shows a portion of the diagram shown in FIG. 3. The system of FIG. 4 includes resistor B (406B), an upper NMOS transistor (408), a reference voltage (416), reference current path B (418B), a lower NMOS transistor (410), leakage current path B (412B), and an output (414).

The circuit shown in FIG. 4 utilizes a stacked FET configuration that includes the upper NMOS transistor (408) and the lower NMOS transistor (410). Within the stacked FET configuration, the lower NMOS transistor (410) is employed to enable and disable the circuit, and the upper NMOS transistor (408) processes the digital signal for the pass through.

Creating a negative voltage at the gate-source of the upper NMOS transistor (408) may drastically reduce the leakage current along leakage current path B (412B), causing the S-D channel of the upper NMOS transistor (408) to be pinched off. In one or more embodiments, the reference voltage (416) is a mechanism by which a positive or negative voltage may be applied to a source of a transistor (e.g., the upper NMOS transistor (408)) or other part of a circuit, causing a reference current along reference current path B (418B).

In one or more embodiments, applying the reference voltage (416) pinches off the S-D channel of the upper NMOS transistor (408). Pinching off the S-D channel of the upper NMOS transistor (408) may reduce the leakage current flowing along leakage current path B (412B) and leakage current flowing through the output (414). The reference voltage (416) may be determined and provided using a variety of circuits and mechanisms without deviating from the scope of present embodiments. Example circuits for determining and providing the reference voltage (416) are described below in reference to FIGS. 6 through 9.

In one or more embodiments, a switch or a gate is employed to disconnect or isolate the reference voltage (416) when the stacked FET path (the upper NMOS transistor (408) and the lower NMOS transistor (410)) is in functional mode (i.e., the transistors are active).

Figure 5:
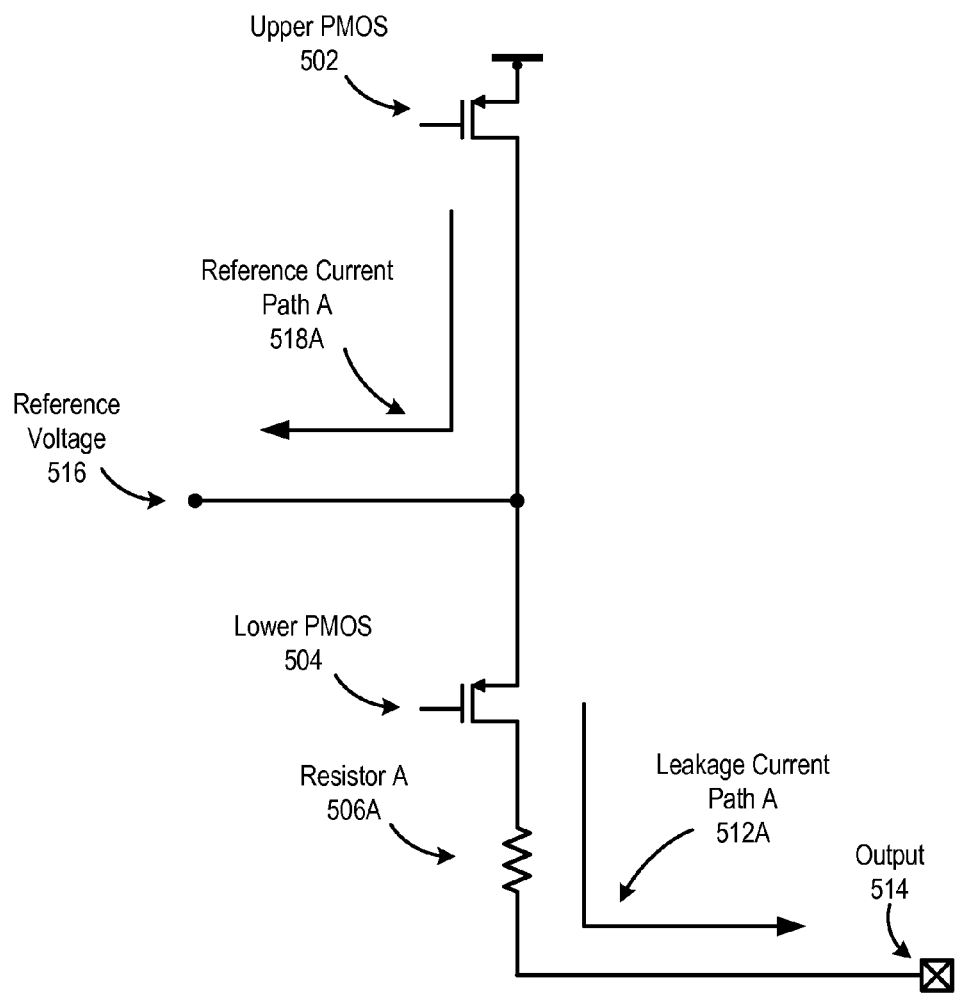
FIG. 5 sets forth a diagram of another example of a circuit device configured according to embodiments.

FIG. 5 sets forth a diagram of a system for reducing leakage current in a testing circuit according to embodiments described herein. Specifically, FIG. 5 shows a portion of the diagram shown in FIG. 3. The system of FIG. 5 includes an upper PMOS transistor (502), reference current path A (518A), a reference voltage (516), a lower PMOS transistor (504), resistor A (506A), leakage current path A (512A), and output (514).

The circuit shown in FIG. 5 utilizes a stacked FET configuration that includes the upper PMOS transistor (502) and lower PMOS transistor (504). Within the stacked FET configuration, the upper PMOS transistor (502) is employed to enable and disable the circuit, and the lower PMOS transistor (504) processes the digital signal for the pass through.

Creating a positive voltage at the gate-source of the lower PMOS transistor (504) may drastically reduce the leakage current along leakage current path A (512A), causing the S-D channel of the lower PMOS transistor (504) to be pinched off. In one or more embodiments, the reference voltage (516) is a mechanism by which a positive or negative voltage may be applied to a source of a transistor (e.g., the lower PMOS transistor (504)) or other part of a circuit, causing a reference current along reference current path A (518A).

In one or more embodiments, applying the reference voltage (516) pinches off the S-D channel of the lower PMOS transistor (504). Pinching off the S-D channel of the lower PMOS transistor (504) may reduce the leakage current flowing along leakage current path A (512A) and leakage current flowing through the output (514). The reference voltage (516) may be determined and provided using a variety of circuits and mechanisms without deviating from the scope of present embodiments. Example circuits for determining and providing the reference voltage (516) are described below in reference to FIGS. 6 through 9.

In one or more embodiments, a switch or a gate is employed to disconnect and/or isolate the reference voltage (516) when the stacked FET path (the upper PMOS transistor (502) and lower PMOS transistor (504)) is in functional mode (i.e., the transistors are active).

In one or more embodiments, the reference voltage (516) is generated by a reference voltage generation circuit. In one or more embodiments, the reference voltage generation circuit or other voltage-providing mechanism supplies a voltage sufficient to pinch off the S-D channel of the transistor processing the digital signal. The reference voltage generation circuit may determine an optimal reference voltage to apply in a variety of ways. A fixed high voltage for reference voltage (416) may not be optimal because too high a reference voltage may increase the leakage of the lower NMOS (410). Although the leakage of the Lower NMOS transistor (410) would not affect the output (414) due to the upper NMOS (408) being fully leakage cutoff, lower leakage of the lower NMOS transistor (410) is generally preferable. IN one or more embodiments, the optimal reference voltage may depend on an output voltage measured at the output (414). Similarly, a fixed low voltage for reference voltage (516) may not be optimal because too low a reference may increase the leakage of the upper PMOS (502). Although the leakage of the upper PMOS (502) would not affect the output (514) due to the lower PMOS (504) being fully leakage cutoff, lower leakage of the upper PMOS (502) is also generally preferable. In one or more embodiments, the optimal reference voltage may depend on an output voltage measured at the output (514).

Figure 6:
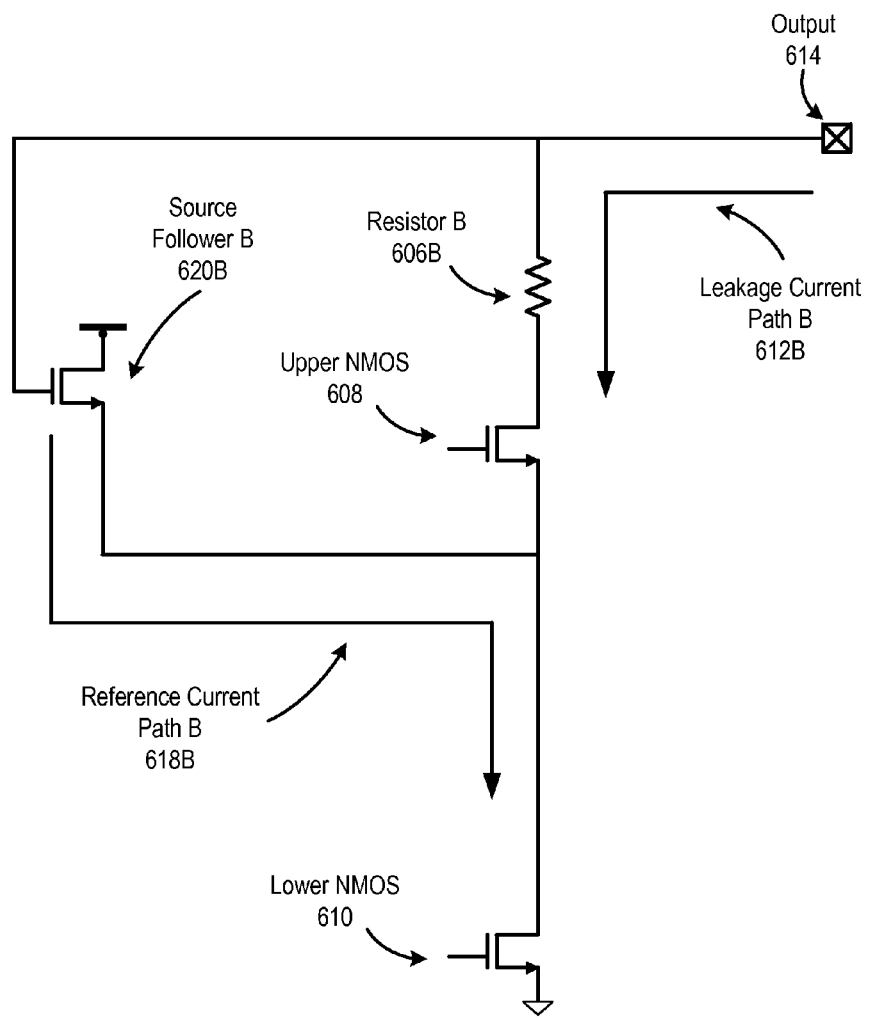
FIG. 6 sets forth a diagram of another example of a circuit device configured according to embodiments.

FIG. 6 sets forth a diagram of a system for reducing leakage current in a testing circuit according to embodiments described herein. Specifically, FIG. 6 shows a configuration of the diagram of FIG. 4 in which the reference voltage is supplied by source follower B (620B). The system of FIG. 6 includes resistor B (606B), an upper NMOS transistor (608), source follower B (620B), reference current path B (618B), a lower NMOS transistor (610), leakage current path B (612B), and an output (614).

Source follower B (620B) shown in FIG. 6 is a reference voltage generation circuit that generates the reference voltage along reference current path B (618B). As shown in FIG. 6, the gate terminal of source follower B (620B) is operatively connected to the output (614), and the source terminal of source follower B (620B) is operatively connected to the source terminal of the upper NMOS transistor (608).

In one or more embodiments, the reference voltage supplied by source follower B (620B) will depend upon the output voltage at the output (614). Specifically, the reference voltage along reference current path B (618B) differs from the output voltage at the output (614) by a threshold voltage, which may depend on the current flowing through the current source in source follower B (620B).

In one or more embodiments, source follower B (620B) does not require a dedicated current source because the lower NMOS transistor (610) acts as the current source. In addition, the output of source follower B (620B) may be relative to the output voltage of the output (614) because source follower B (620B) draws only leakage current. Further, although source follower B (620B) may be inoperable with only a small leakage current from the lower NMOS transistor (610), there may be no need for source follower B (620B) to be functional when the leakage current is insignificant.

Figure 7:
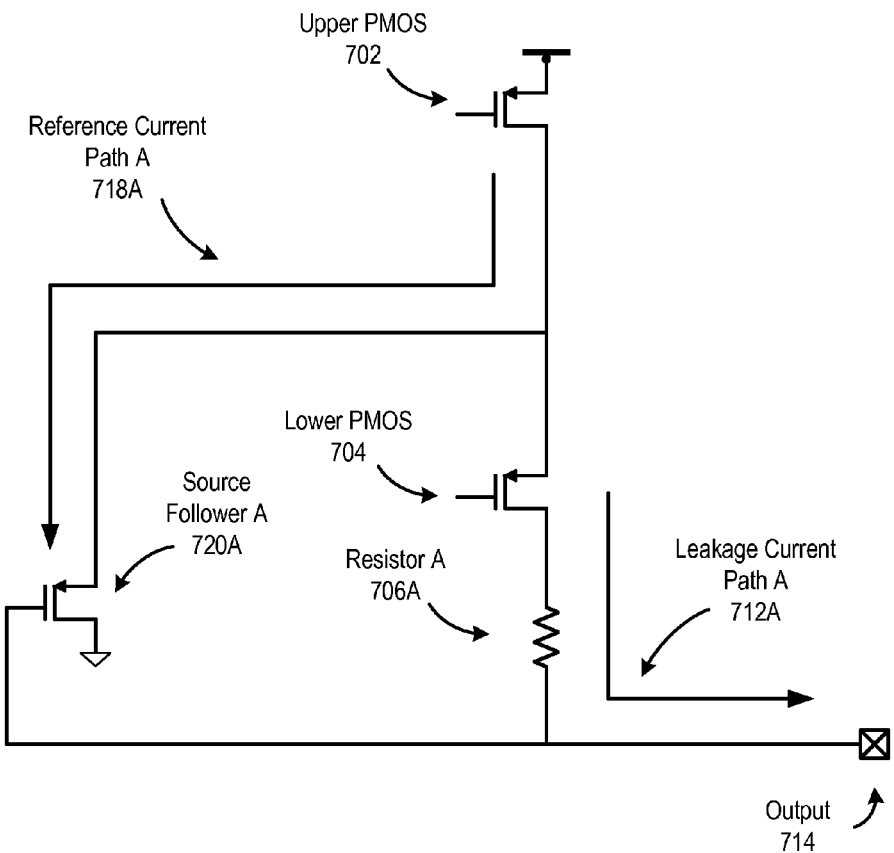
FIG. 7 sets forth a diagram of another example of a circuit device configured according to embodiments.

FIG. 7 sets forth a diagram of a system for reducing leakage current in a testing circuit according to embodiments described herein. Specifically, FIG. 7 shows a configuration of the diagram of FIG. 5 in which the reference voltage is supplied by source follower A (720A). The system of FIG. 7 includes an upper PMOS transistor (702), reference current path A (718A), source follower A (720A), a lower PMOS transistor (704), resistor A (706A), leakage current path A (712A), and output (714).

Similar to the system shown in FIG. 6, FIG. 7 shows a circuit in which the reference voltage is supplied by source follower A (720A). Specifically, source follower A (720A) shown in FIG. 6 is a reference voltage generation circuit that generates the reference voltage along reference current path A (718A). As shown in FIG. 7, the gate terminal of source follower A (720A) is operatively connected to the output (714), and the source terminal of source follower A (720A) is operatively connected to the source terminal of the lower PMOS transistor (704).

In one or more embodiments, the reference voltage supplied by source follower A (720A) will depend upon the output voltage at the output (714). Specifically, the reference voltage along reference current path B (618B) differs from the output voltage at the output (714) by a threshold voltage, which may depend on the current flowing through the current source in source follower A (720A).

In one or more embodiments, source follower A (720A) does not require a dedicated current source because the upper PMOS transistor (702) acts as the current source. In addition, the output of source follower A (720A) may be relative to the output voltage of the output (714) because source follower A (720A) draws only leakage current. Further, although source follower A (720A) may be inoperable with only a small leakage current from the upper PMOS transistor (702), there may be no need for source follower A (720A) to be functional when the leakage current is insignificant.

Figure 8:
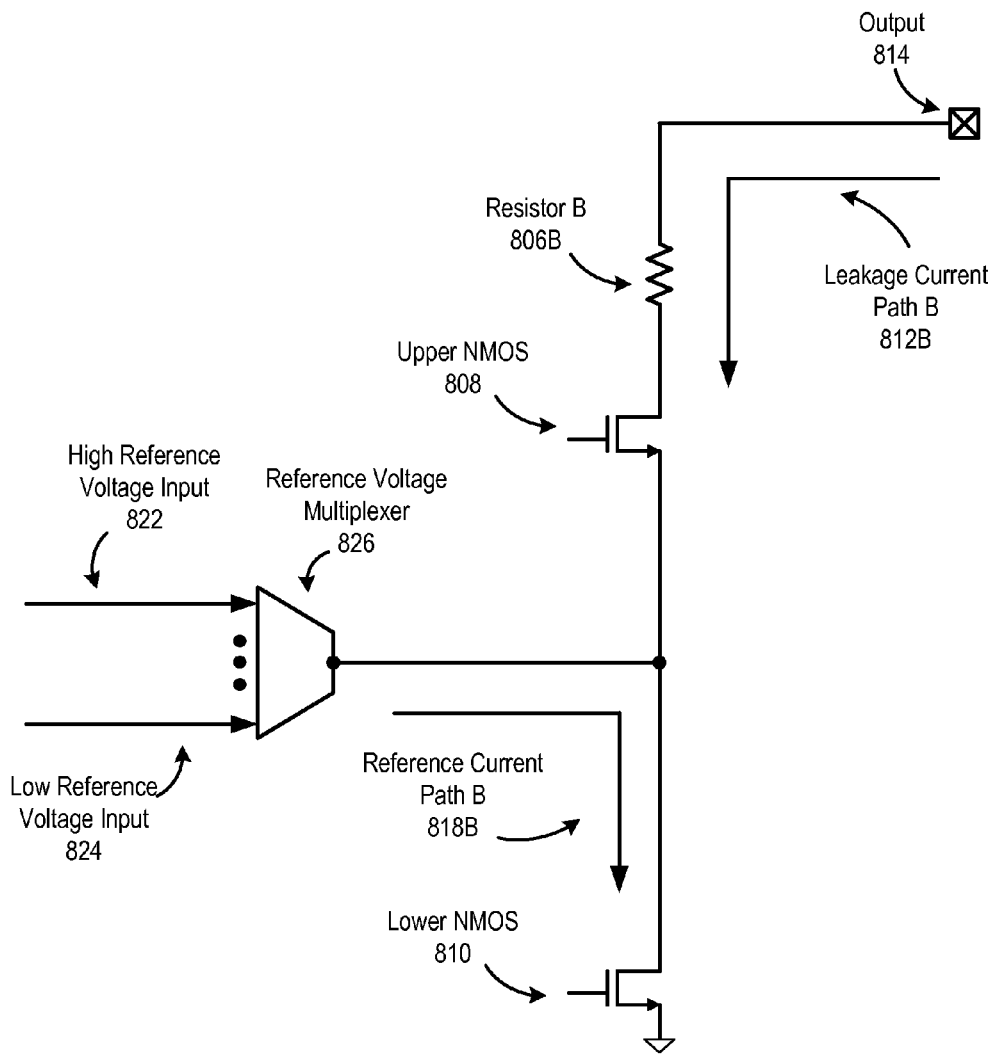
FIG. 8 sets forth a diagram of another example of a circuit device configured according to embodiments.

FIG. 8 sets forth a diagram of a system for reducing leakage current in a testing circuit according to embodiments described herein. The system of FIG. 8 includes resistor B (806B), an upper NMOS transistor (808), a high reference voltage input (822), a low reference voltage input (824), a reference voltage multiplexer (826), reference current path B (818B), a lower NMOS transistor (810), leakage current path B (812B), and an output (814). Specifically, FIG. 8 shows a configuration of the diagram of FIG. 4 in which the reference voltage is supplied by a reference voltage generation circuit implemented as the reference voltage multiplexer (826).

As shown in FIG. 8, a range of reference voltage inputs (high reference voltage input (822), low reference voltage input (824)) are supplied to the reference voltage multiplexer (826). The reference voltage inputs (high reference voltage input (822), low reference voltage input (824)) may be selected as a function of the output (814). Alternatively, the reference voltage inputs (high reference voltage input (822), low reference voltage input (824)) may be supplied independent of the output (814).

The reference voltage multiplexer (826) may be programmed with a suitable algorithm that selects the appropriate reference voltage input to apply to the circuit. In one or more embodiments, an optimal reference voltage is one high enough to pinch off the S-D channel of the upper NMOS transistor (808) (or low enough to pinch off the S-D channel of the lower PMOS transistor in a PMOS circuit). However, the higher the reference voltage, the more leakage current may be generated by the lower NMOS transistor (810). Similarly, in a PMOS circuit, the lower the reference voltage, the more leakage current may be generated by the upper PMOS transistor. Therefore, an optimal reference voltage input may pinch off the S-D channel without generating additional leakage current.

Figure 9:
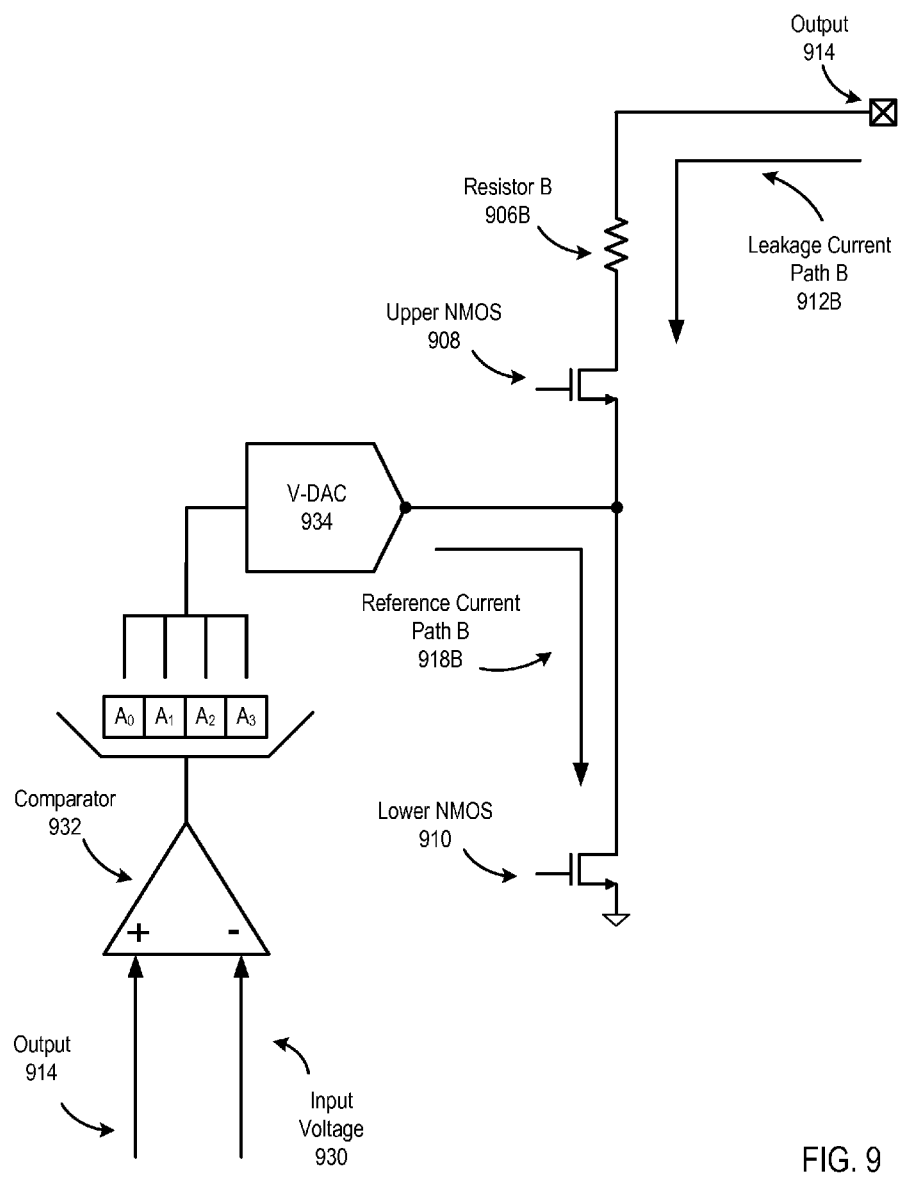
FIG. 9 sets forth a diagram of another example of a circuit device configured according to embodiments.

FIG. 9 sets forth a diagram of a system for reducing leakage current in a testing circuit according to embodiments described herein. Specifically, FIG. 9 shows a configuration of the diagram of FIG. 4 in which the reference voltage is supplied by a voltage digital to analog converter (V-DAC) (934). The system of FIG. 9 includes resistor B (906B), an upper NMOS transistor (908), an output voltage (914), an input voltage (930), a comparator (932), the V-DAC (934), reference current path B (918B), a lower NMOS transistor (910), leakage current path B (912B), and an output (914).

As shown in FIG. 9, the reference voltage generation circuit is implemented as the comparator (932) and the V-DAC (934). The comparator (932) receives feedback from the circuit via the output voltage (914) and the input voltage (930). The input voltage (930) may be the analog input (202) from the circuit under test (102) which the testing circuit (200) is configured to accurately pass to output (210). The output voltage (914) is compared to the input voltage (930). Subsequently, the comparator (932) output changes the register values ($A_0, A_1, A_2, A_3$) that store the input for the V-DAC (934). The V-DAC (934) then outputs a reference voltage based on the register values ($A_0, A_1, A_2, A_3$). Although FIG. 9 shows a V-DAC (934) using four register values ($A_0, A_1, A_2, A_3$), a different DAC implementation or a DAC implementation with a different number of register bits may be used without exceeding the scope of present embodiments.

The reference voltage generation circuit shown in FIG. 9 is a closed loop operation and may be functional for any output voltage (914) value. Further, the reference voltage generation circuit shown in FIG. 9 may adjust for both temperature and voltage fluctuations.

The following is an example algorithm that may be implemented using the circuit shown in FIG. 9. The first step includes selecting a starting value for the reference voltage. For example, a low value may be selected for an NMOS circuit and a high value may be selected for a PMOS circuit. The second step includes defining a tolerance. The tolerance may be a function of the input voltage (930) or a fixed value. In one or more embodiments, the tolerance may be set in the offset voltage of the comparator (932) and the input voltage (930). In one or more embodiments, the tolerance may be accounted for using an input voltage (930) that is a fraction of the voltage required to be measured.

The third step includes comparing the output voltage (914) to the input voltage (930) to determine whether the input voltage (930) is larger than the output voltage (914) plus the tolerance. If the input voltage (930) is larger than the output voltage (914) plus the tolerance, then the reference voltage is increased, and the algorithm returns to the third step. If the input voltage (930) is not larger than the output voltage (914) plus the tolerance, then the reference voltage is decreased, and the algorithm returns to the third step.

Figure 10:
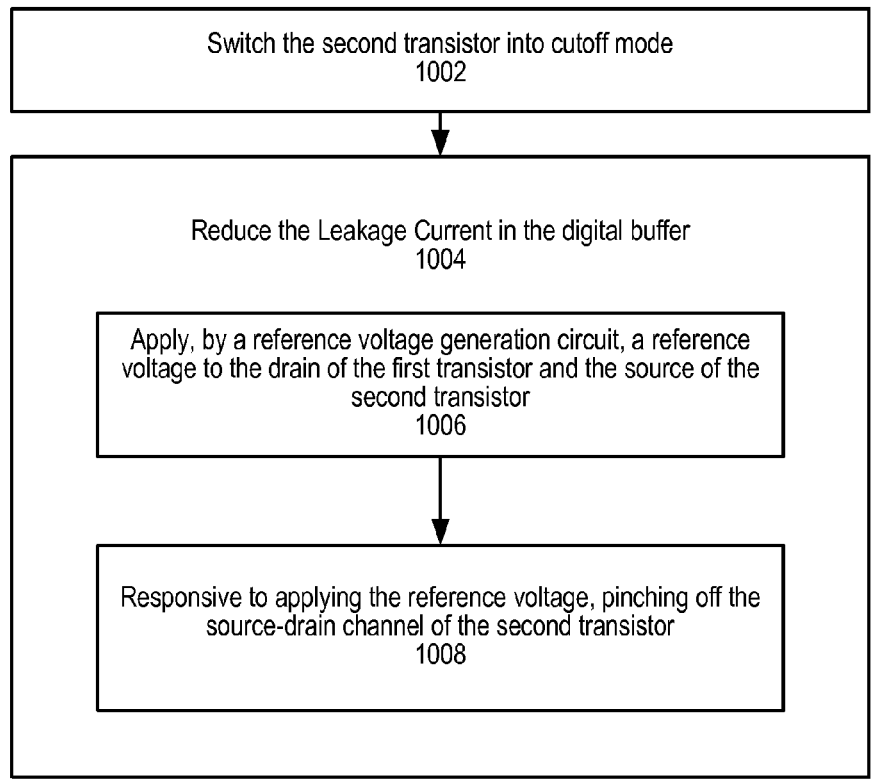
FIG. 10 sets forth a flow chart illustrating an exemplary method for reducing leakage current in stacked field-effect transistors (FETs) according to embodiments.

For further explanation, FIG. 10 sets forth a flow chart illustrating an exemplary method for reducing leakage current in a digital buffer according to embodiments described herein. The digital buffer may include a first transistor and a second transistor, where the drain of the first transistor is operatively coupled to the source of the second transistor. In such an embodiment, the method of FIG. 10 includes switching (1002) the second transistor into cutoff mode and reducing (1004) the leakage current in the digital buffer (1004). Switching (1002) the second transistor into cutoff mode may include, for example, applying a voltage to a gate terminal of the transistor such that the transistor is turned off (i.e., the current flowing through the S-D channel of the transistor is close to zero).

In the method of FIG. 10, reducing (1004) the leakage current in the digital buffer includes applying (1006), by a reference voltage generation circuit, a reference voltage to the drain of the first transistor and the source of the second transistor. Responsive to applying the reference voltage, the method of FIG. 10 continues by pinching (1008) off the source-drain channel of the second transistor.

It will be understood from the foregoing description that modifications and changes may be made in various embodiments without departing from its true spirit. The descriptions in this specification are for purposes of illustration only and are not to be construed in a limiting sense. The scope of the present disclosure is limited only by the language of the following claims.

What is claimed is:

1. A method for reducing leakage current in a digital buffer, the digital buffer comprising a first P-channel field effect transistory ("PFET") having a source connected to a voltage source and a drain connected to a source of a second PFET, the second PFET having a drain connected through a first resistor to an output of the buffer and through a second resistor to a drain of a first N-channel field effect transistor ("NFET"), the first NFET having a source connected to a drain of a second NFET, the second NFET having a source connected to ground, the method comprising:

a first P-channel field effect transistory ("PFET") having a source connected to a voltage source and a drain connected to a source of a second PFET, the second PFET having a drain connected through a first resistor to an output of the buffer and through a second resistor to a drain of a first N-channel field effect transistor ("NFET"), the first NFET having a source connected to a drain of a second NFET, the second NFET having a source connected to ground, switching the second NFET into cutoff mode; and applying to the source of the first NFET and the drain of the second NFET, a reference voltage effecting a gate-to-source bias voltage on the first NFET large enough to substantially eliminate leakage current from the channel of the first NFET.

2. A digital buffer comprising:

a first P-channel field effect transistory ("PFET") having a source connected to a voltage source and a drain connected to a source of a second PFET;

the second PFET having a drain connected through a first resistor to an output of the buffer and through a second resistor to a drain of a first N-channel field effect transistor ("NFET");

the first NFET having a source connected to a drain of a second NFET;

the second NFET having a source connected to ground, the second NFET switched into cutoff mode; and a reference voltage generation circuit that connects, to the source of the first NFET and the drain of the second NFET, a reference voltage effecting a gate-to-source bias voltage on the first NFET large enough to substantially eliminate leakage current from the channel of the first NFET.

* * * * *